United States Patent
Aman et al.

[11] Patent Number: 6,134,276
[45] Date of Patent: Oct. 17, 2000

[54] TIMING RECOVERY SYSTEM

[75] Inventors: Ahmad K. Aman, Fairfax, Va.; Cecil William Farrow, Highlands Borough, N.J.; Hong Jiang, Montclair, N.J.; Agesino Primatic, Jr., Frenchtown, N.J.; Charles Albert Webb, III, Rumson Borough, N.J.

[73] Assignee: Lucent Technologies Inc., Murray Hill, N.J.

[21] Appl. No.: 09/052,454

[22] Filed: Mar. 31, 1998

[51] Int. Cl.[7] .................................................. H04L 27/14
[52] U.S. Cl. .......................................... 375/326; 375/327
[58] Field of Search ..................................... 375/326, 324, 375/322, 316, 232, 235, 344, 226, 373, 371, 362

[56] References Cited

U.S. PATENT DOCUMENTS

| | | | |
|---|---|---|---|
| 4,849,991 | 7/1989 | Arnold et al. | 375/330 |
| 5,703,905 | 12/1997 | Langberg | 375/232 |
| 5,796,786 | 8/1998 | Lee | 375/326 |
| 5,809,009 | 9/1998 | Matsuoka et al. | 370/206 |

*Primary Examiner*—Stephen Chin
*Assistant Examiner*—Lenny Jiang

[57] ABSTRACT

A digital timing recovery system advantageously employs both demodulated I-phase and Q-phase components to more accurately locate the synchronization signal of an incoming VSB signal. The Q-phase component is advantageously employed to detect the phase error. The use of the Q-phase component provides a more accurate measure of the phase error and results in a larger (wider) acquisition range for timing frequency offset. More specifically, the timing recovery system of this invention performs symbol clock recovery based on the VSB signal segment synchronization (sync) signal and generates a pulse density modulated (PDM) phase difference signal that controls a voltage controlled crystal oscillator (VCXO) in the phase-locked loop. This is realized, in one embodiment of the invention, by correlating received sync segment data with the known sync signal pattern and searching for "peaks" in the correlation values that are periodic at the known sync segment data rate. Once the sync pattern is found, the correlation values for adjacent samples are advantageously employed to generate the necessary feedback control signal value for the VCXO. Technical advantages of applicants' unique invention are that the need for an analog synchronous detector is eliminated, a more accurate measure than that obtained by prior known systems is obtained and a wider acquisition range is obtained for timing frequency offset.

28 Claims, 5 Drawing Sheets

100

109

TIMING RECOVERY SYSTEM

RELATED APPLICATIONS

U.S. patent application Ser. No. 09/052,455 was filed concurrently herewith. U.S. patent applications Ser. No. 08/777,889 and Ser. No. 08/777,893 were filed on Dec. 31, 1996, now U.S. Pat. No. 5,963,594 issued on Oct. 5, 1999 and U.S. Pat. No. 5,870,442 issued on Feb. 9, 1999, respectively.

TECHNICAL FIELD

This invention relates to demodulator arrangements and, more particularly, to timing recovery in such demodulator arrangements.

BACKGROUND OF THE INVENTION

Demodulators are employed in vestigial side band (VSB) receivers to obtain in-phase (I-phase) and quadrature-phase (Q-phase) components of the received VSB signal. Prior known timing recovery systems, however, typically utilized only the I-phase component in attempts at obtaining adequate timing recovery. Additionally prior known systems employed an analog synchronous detector in combination with a digital phase-locked loop to recover timing. Such prior systems had relatively limited acquisition range and had limited accuracy in determining the location on an incoming synchronization signal in order to recover the timing of the incoming VSB signal.

SUMMARY OF THE INVENTION

These and other problems of prior known timing recovery systems are overcome by employing a digital timing recovery system which advantageously employs both the demodulated I-phase and Q-phase components to more accurately locate the synchronization signal of the incoming VSB signal. The Q-phase component is advantageously employed to detect the phase error. The use of the Q-phase component provides a more accurate measure of the phase error and results in a larger (wider) acquisition range for timing frequency offset.

More specifically, the timing recovery system of this invention performs symbol clock recovery based on the VSB signal segment synchronization (sync) signal and generates a pulse density modulated (PDM) phase difference signal that controls a voltage controlled crystal oscillator (VCXO) in the phase-locked loop. This is realized, in one embodiment of the invention, by correlating received sync segment data with the known sync signal pattern and searching for "peaks" in the correlation values that are periodic at the known sync segment data rate. Once the sync pattern is found, the correlation values for adjacent samples are advantageously employed to generate the necessary feedback control signal value for the VCXO.

Technical advantages of applicants' unique invention are that the need for an analog synchronous detector is eliminated, a more accurate measure than that obtained by prior known systems is obtained and a wider acquisition range is obtained for timing frequency offset.

DETAILED DESCRIPTION

Figure 1:
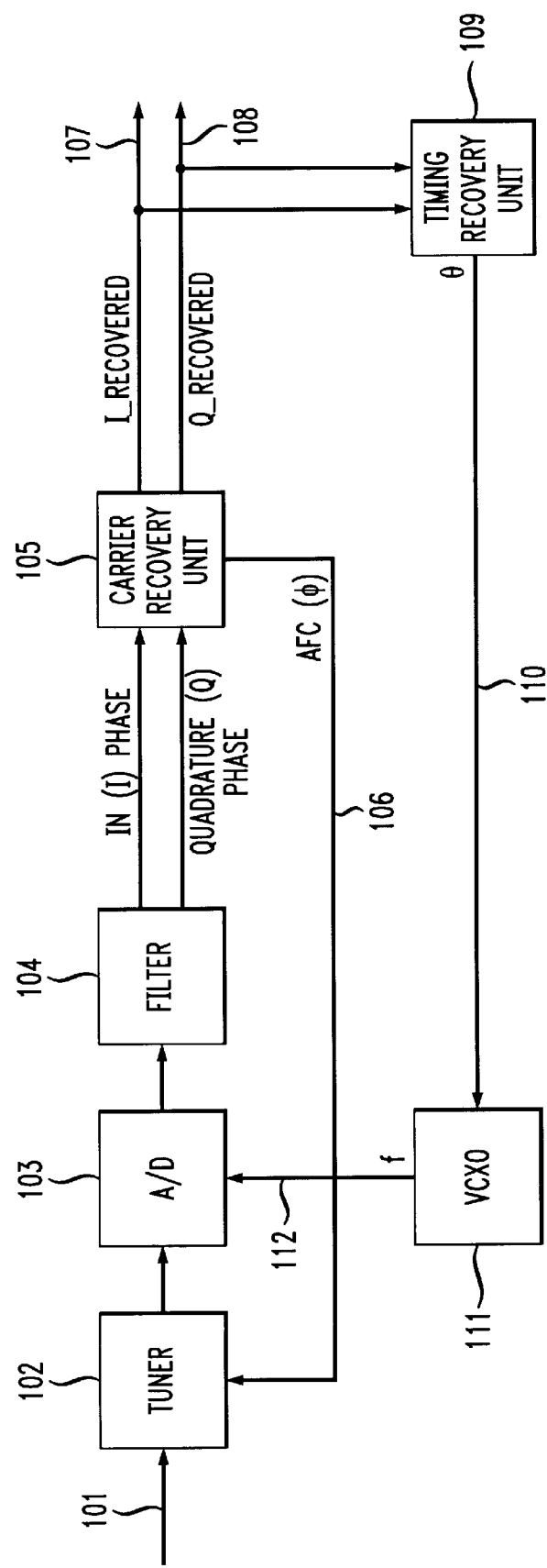
FIG. 1 illustrates, in simplified block diagram form, portions of a demodulator employing an embodiment of the invention.

FIG. 1 shows, in simplified block diagram form details of a portion of a demodulator 100 that employs an embodiment of the invention. Demodulator 100 includes, in this example, apparatus 101 for receiving an incoming signal, for example, a digital video signal which, in turn, is supplied to tuner 102 of a type known in the art. Also supplied to tuner 102 is an automatic frequency control (AFC) signal, namely, φ, for controlling tuner 102 to stay tuned to a desired incoming signal frequency. It should be noted that for completeness of exposition tuner 102 is shown as being adjusted by AFC (φ), however, in many applications adjustment of tuner 102 is not required. An intermediate frequency signal output from tuner 102 is supplied to analog-to-digital (A/D) converter 103. Also supplied to A/D 103 is a timing signal f at a predetermined frequency. A digital version of the intermediate frequency signal is supplied to filter 104. Filter 104 is a matched filter, of a type well known in the art, which performs matched filtering, decimation and a Hilbert transform of the digital samples from A/D 103 to yield separate In (I) phase (I-phase) and Quadrature (Q) phase (Q-phase) passband components. The I-phase and Q-phase components are supplied to carrier recovery unit 105. As will be explained in detail below, carrier recovery unit 105 generates an In phase recovered (I-Recovered) component and a Quadrature phase recovered (Q-Recovered) component, as well as, the AFC signal. The AFC signal is supplied via circuit path 106 to tuner 102, while I-Recovered and Q-Recovered are supplied via circuit paths 107 and 108, respectively, to additional portions of the demodulator (not shown) and to timing recovery unit 109. In turn, timing recovery unit 109 generates timing control signal, i.e., phase θ, which is supplied to voltage controlled crystal oscillator (VCXO) 111. VCXO 111 is responsive to timing control signal θ to generate timing signal f, which is supplied via circuit path 112 to A/D 103.

Figure 2:
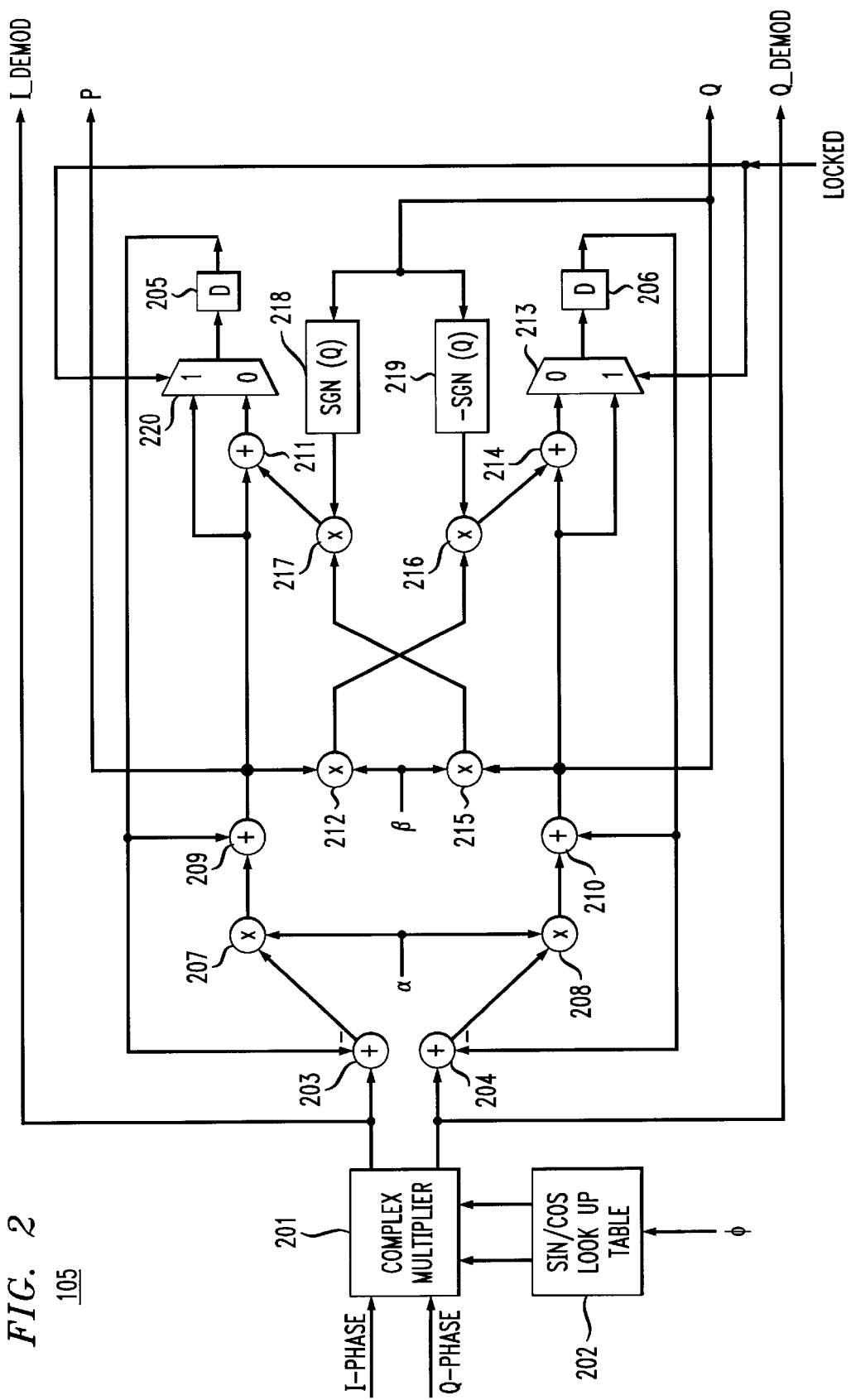
FIGS. 2, 3 and 4 illustrate, in simplified block diagram form, details of the carrier recovery unit of FIG. 1.
Figure 3:
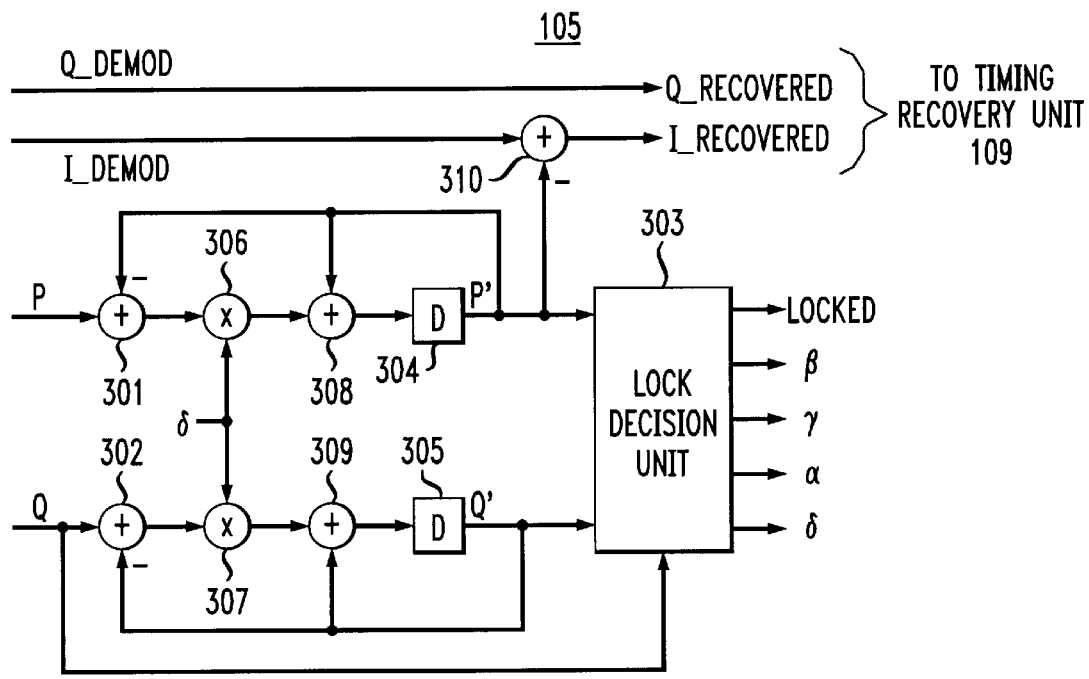
Figure 4:
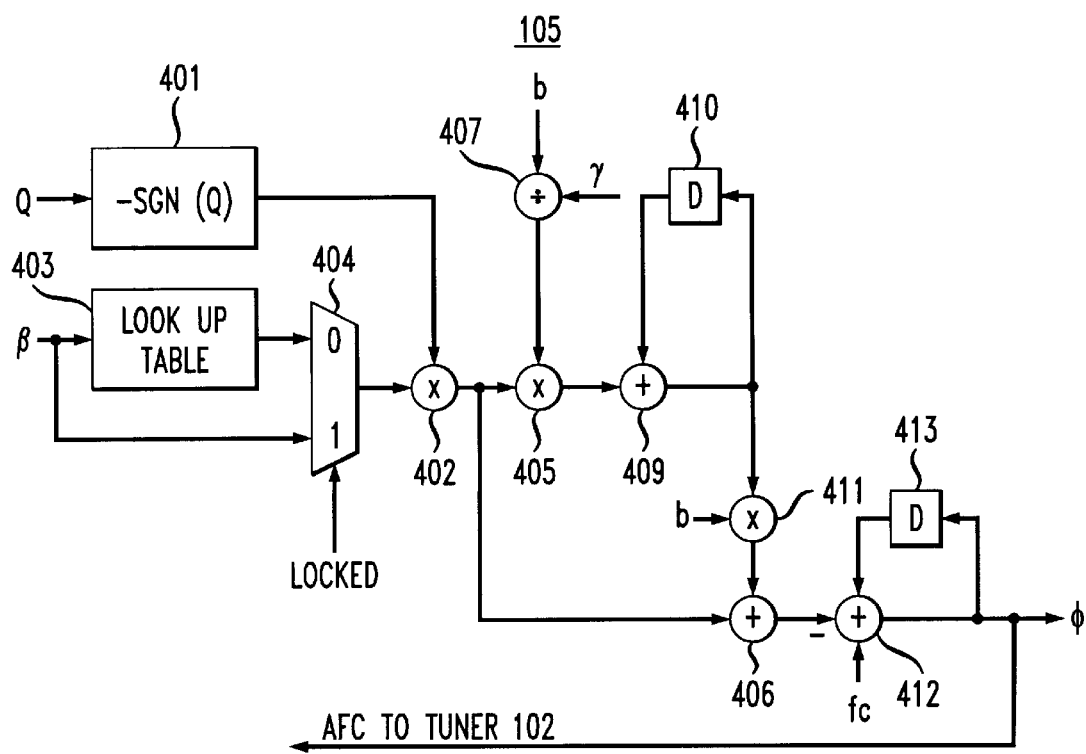

FIGS. 2, 3 and 4 show, in simplified form, details of an embodiment of carrier recovery unit 105. Referring to FIG. 2, shown is complex multiplier 201 to which the I-phase and Q-phase signal components are supplied. Complex multiplier 201 in conjunction with SIN/COS look up table 202 demodulates the I-phase and Q-phase signal components to obtain signals representative of I_demod and Q_demod, respectively. The demodulation is realized by complex multiplication of the I-phase and Q-phase signal components with a complex exponential sequence. The exponential sequence is supplied by SIN/COS look up table 202 in response to frequency control signal φ. Such complex multiplier arrangements used for demodulation are well known in the art. The value of I_demod is supplied to one input of combining unit 203 and the value of Q_demod is supplied to one input of combining unit 204. An output from standard delay (D) unit 205 is supplied to a negative input of combining unit 203 and to an input of combining unit 209. Similarly, an output from standard delay (D) unit 206 is supplied to a negative input of combining unit 204 and to an input of combining unit 210. Standard delay units 205 and 206 are, for example, infinite impulse response (IIR) filters of a type known in the art. Constant $\alpha=2^{-W}$ is supplied to multipliers 207 and 208 to realize exponential smoothing of outputs from combining units 203 and 204, respectively. It should be noted that W is as large as practical in the tracking mode of operation. In this example for carrier recovery, W has a range of 5–14 and for the acquisition mode ($\alpha_1$) W=12 and for the tracking mode ($\alpha_0$) W=6. Combining unit 209 combines the output of multiplier 207 and the output standard delay unit 205 to obtain P. P (first average) is an average of I_demod. P is supplied to the 1 input of selector 210, to an input of combining unit 211 and an input of multiplier 212. Similarly, combining unit 210 combines the output of multiplier 208 and the output standard delay unit 206 to obtain Q. Q (second average) is an average of Q_demod. Q is supplied to the 1 input of selector 213, to an input of combining unit 214, an input of multiplier 215, to −sgn (sign) (Q) unit 219 and to sgn(Q) unit 218. $\beta=2^{-X}$ is supplied to an input of each of multipliers 212 and 215. In this example for carrier recovery, X has a range of 3–12. In the acquisition mode X=4 ($\beta_0$), X=8 ($\beta_1$) or ($\beta_2$) X=10 which provide a number of step changes in the phase during the acquisition mode of operation, as shown below. In FIG. 2, when in the tracking mode β is not employed because the values of P and Q are not modified or adjusted. The output from multiplier 212 is an adjusted version of P that is supplied to an input of multiplier 216 and the output from multiplier 215 is an adjusted version of Q that is supplied to an input of multiplier 217. A signal representative of −sgn (Q) is supplied from −sgn (Q) unit 219 to multiplier 216 and a signal representative of sgn (Q) is supplied from sgn (Q) unit 218 to an input of multiplier 217. The resulting output from multiplier 217 is supplied to combing unit 211, where it is algebraically added to adjust the value of P. The resulting output from combining unit 211 is supplied to the 0 input of selector 210. The resulting output from multiplier 216 is supplied to combing unit 214 where it is algebraically added to adjust the value of Q. The resulting output from combining unit 211 is supplied to the 0 input of selector 213. An output from selector 210 is supplied to the input of standard delay unit 205 and an output from selector 213 is supplied to the input of standard delay 206. The mode of operation, i.e., acquisition or tracking, is controlled by a "locked" signal supplied to selectors 210 and 213 to select as an output the signal supplied to either the 0 input or the 1 input. Note that in the acquisition mode (0) the adjusted values of P and Q are selected which enable locking to the carrier more rapidly. In the tracking mode (1) the non-adjusted values of P and Q are used that have been obtained by employing the smaller values of α and β. Again, the use of the non-adjusted values of P and Q provides significantly better tracking of phase in the presence of phase noise. Generation of the locked signal and the adjustment of parameters α and β are described below in relationship to FIG. 3. It is noted that for the acquisition mode of operation that α is large in order to obtain the average of P and Q. The use of the larger value of α is desirable to "lock" onto the carrier phase rapidly. However in the tracking mode α is smaller in value than that used in the acquisition mode. Otherwise, it is difficult to track the phase in the presence of phase noise. Thus it can be shown by employing the relatively large values of α and β relatively fast convergence is obtained initially during the acquisition mode and then relatively quiet operation of the vector tracking filter of FIG. 2 is realized in the tracking mode by employing the smaller values of α and β. One such vector tracking filter is disclosed in co-pending United States patent application of C. W. Farrow Ser. No. 08/777,889, filed Dec. 31, 1996, now U.S. Pat. No. 5,963,594 issued Oct. 5, 1999 and assigned to the assignee of this patent application. Note that α, β and locked are supplied from lock decision unit 303 (FIG. 3).

Referring now to FIG. 3, it is shown that P is supplied to an input of combining unit 301 while Q is supplied to one input of combining unit 302. Q is also supplied to lock decision unit 303. An output of standard delay (D) unit 304, namely, P', is supplied to a negative input of combining unit 301, where it is algebraically subtracted from P, to an input of combining unit 308, to an input of combining unit 310 and to lock decision unit 303. P' (third average) is an average of P and is referred to as a second average of I_demod. An output of standard delay (D) unit 305, namely, Q', is supplied to a negative input of combining unit 302, where it is algebraically subtracted from Q, to an input of combining unit 309 and to lock decision unit 303. Again, in this example, standard delay units 304 and 305 are IIR filters. Q' (fourth average) is an average of Q and is referred to as a second average of Q_demod. An output from combining unit 301 is supplied to multiplier 306 and an output from combining unit 302 is supplied to multiplier 307. Also supplied to multipliers 306 and 307 is parameter $\delta=2^{-Z}$ from lock decision unit 303. In this example, Z has a range of 12–18 and typically is 16. The outputs of multipliers 306 and 307 are adjusted values of the outputs from combing units 301 and 302, respectively, and are supplied to combining units 308 and 309, respectively. The adjusted values of P and Q from combining units 308 and 309 are supplied to standard delay units 304 and 305, respectively, which yield the third and fourth average values P' and Q', respectively. Lock decision unit 303 is operative to generate the "locked" signal for controlling carrier recovery unit 105 to be in the acquisition mode or the tracking mode and to provide parameters α, β, γ and δ. I_demod is supplied to one input of combining unit 310 and P' is supplied to another input where it is algebraically subtracted from I_demod. This subtraction of P' removes the direct current (D.C.) pilot signal to yield I_recovered. As indicated Q_demod is also Q_recovered. Q_recovered and I_recovered are supplied to other portions of the demodulator and to timing recovery unit 109.

The operational mode, i.e., acquisition or tracking, of carrier recovery system 105 and the values of parameters α, β, γ and δ are determined by lock decision unit 303. In the following process $\gamma=2^{-Y}$, $k=2^{-M}$, $S=2^{-N}$ and $b=2^{-O}$. The locking decision is determined by:

if $(|Q'|<(|P'|\cdot 2^{-U}))$ then
   $\beta=\beta_0$, $\gamma=\gamma_0$, c=c+1
else if $(|Q'|<(|P'|\cdot 2^{-V}))$ then
   $\beta=\beta_1$, $\gamma=\gamma_1$, c=0
else
   $\beta=\beta_2$, $\gamma=\gamma_2$, c=0
end if
if (c≧L) then
   locked=1
   c=L
   $\beta=Q\cdot 2^{-M}$
else
   locked=0
end if
if (locked=0) then
   $\alpha=\alpha_1$
else
   $\alpha=\alpha_0$
end if $\delta=\delta_0-\alpha$ Parameters $\alpha_0$, $\alpha_1$, $\beta_0$, $\beta_1$, $\beta_2$, $\gamma_0$, $\gamma_1$, $\gamma_2$, $\delta_0$, k, $S_1$, $S_2$, and L are tunable parameters that depend on the particular characteristics of tuner 102 (FIG. 1) that is being employed to receive the incoming signal. Values of these parameters are stored in lock decision unit 303.

Note that programmable hysteresis is obtained in the locking decision process by the selection of the value of L and the use of counter c. Through the selection of the value of L the duration of the interval before which a locking decision is made can be adjusted as desired. Additionally, counter c is incremented during a portion of the acquisition decision process and set to zero (0) during other portions of the acquisition process, as indicated above. Once the mode is switched from acquisition to tracking, the value of counter c is set to c=L. Thus, the desired hysteresis is realized in switching from the acquisition mode to the tracking mode and also from the tracking mode back to the acquisition mode. During the acquisition mode the bandwidth is narrower than during the tracking mode. This is because a larger value for α is employed than in the tracking mode. Further, the phase during the tracking mode is linear because Q is linear and a fixed shift is realized in the linear phase because k is a fixed value, as shown above.

In summary, the parameters in this example for carrier recovery unit 105 are by way of example only, as follows:

$\alpha_0$, $\alpha_1$: range of W: 5–14
typical values: $\alpha_0$, W=6,
$\alpha_1$, W=12;

$\beta_0$, $\beta_1$, $\beta_2$: range of X: 3–12
typical values: $\beta_0$, X=4,
$\beta_1$, X=8,
$\beta_2$, X=10;

$\gamma_0$, $\gamma_1$, $\gamma_2$, range of Y: 5–14
typical values: $\gamma_0$, Y=6,
$\gamma_1$, Y=8,
$\gamma_2$, Y=10;

$\delta_0$ range of Z: 12–18
typical value: $\delta_0$, Z=16;

k range of M: 2–8
typical value: k, M=4;

$S_1$, $S_2$ range of N: 2–4
typical values: $S_1$, N=4,
$S_2$, N=2;

L range: 16384–65536
typical value: L=32768;

b range O: 10–16
typical value: O=14.

FIG. 4 shows, in simplified form, further details of carrier recovery unit 105. Shown is Q being supplied to –sgn (Q) unit 401. The obtained –sign value of Q is supplied to an input of multiplier 402. Parameter β is supplied from lock decision unit 303 (FIG. 3) to an input of look table 403 and to a one (1) input of selector 404. An output from look up table 403 is supplied to the zero (0) input of selector 404. Look up table 403 in response to a supplied value of P, outputs a corresponding phase_error value. To this end, $$phase\_error = \frac{2^{B-\beta}}{2\pi},$$

where B is the bitwidth of frequency control signal φ and, in this example, has a typical value of B=16. Typical values of the phase_error, for this example, are from an approximation of the above phase_error equation, namely, $$phase\_error \approx \frac{10430}{2^\beta}$$

and are:

| β | phase_error |
|---|---|
| 0 | 10430 |
| 1 | 5215 |
| 2 | 2608 |
| 3 | 1304 |
| 4 | 652 |
| * | * |
| * | * |
| * | * |
| 10 | 10. |

The state of the locked signal that is supplied to selector 404 depends on the mode of operation of carrier recovery unit 105. As indicated above, locked is 0 for the acquisition mode and 1 for the tracking mode. The phase error is multiplied by the –sgn (Q) via multiplier 402 and the result is supplied to multiplier 405 and an input of combining unit 406. Also supplied to multiplier 405 is the result of the division of b and γ by divider 407. the parameter b=$2^{-O}$ and the parameter γ=$2^{-Y}$. Typical values for b and γ are shown above. An output from multiplier 405 in supplied to one input of combining unit 409 and an output from standard delay (D) unit 410, which is a delayed version of the output from combining unit 409, is supplied to another input of combining unit 409, where it is algebraically added to the output from multiplier 405. An output from combining unit 409 is representative of the accumulation of the carrier frequency offset and is supplied to an input of standard delay unit 410 and to an input of multiplier 411. Standard delay unit 410 is also an IIR filter, in this example. Parameter b is supplied to another input multiplier 411 to be multiplied with the output from combining unit 409. A resulting output from multiplier 411 is supplied to another input of combining unit 406 where it is algebraically added to the output from multiplier 402. An output from combining unit 406 is supplied to an input of combining unit 412. A modulation frequency value (fc) is supplied to a subtracting input of combining unit 412, while a delayed version of an output from combining unit 412 is supplied via standard delay (D) unit 413 to another input of combining unit 412. Standard delay units 410 and 412 are, in this example, also IIR filters. The supplied inputs are algebraically combined via combing unit 412 to yield frequency control signal φ. Frequency control signal φ is supplied to other portions of the demodulator (not shown) and as automatic frequency control signal φ (AFC) to tuner 102 (FIG. 1). Note that the bitwidth of frequency control signal φ is typically B=16.

The bitwidth F employed in delay unit 410 (FIG. 4) is determined by:

F=O+w;

where $$w = \log_2\left(\frac{max.carrier.freq.offset}{symbol.freq.} \cdot 2^B\right) + 1 \text{ and}$$

typical values for the max. carrier freq. offset are: ±150 kHz, a typical symbol freq. value is 10.76 MHz and, as indicated above, a typical value for B is 16.

Figure 5:
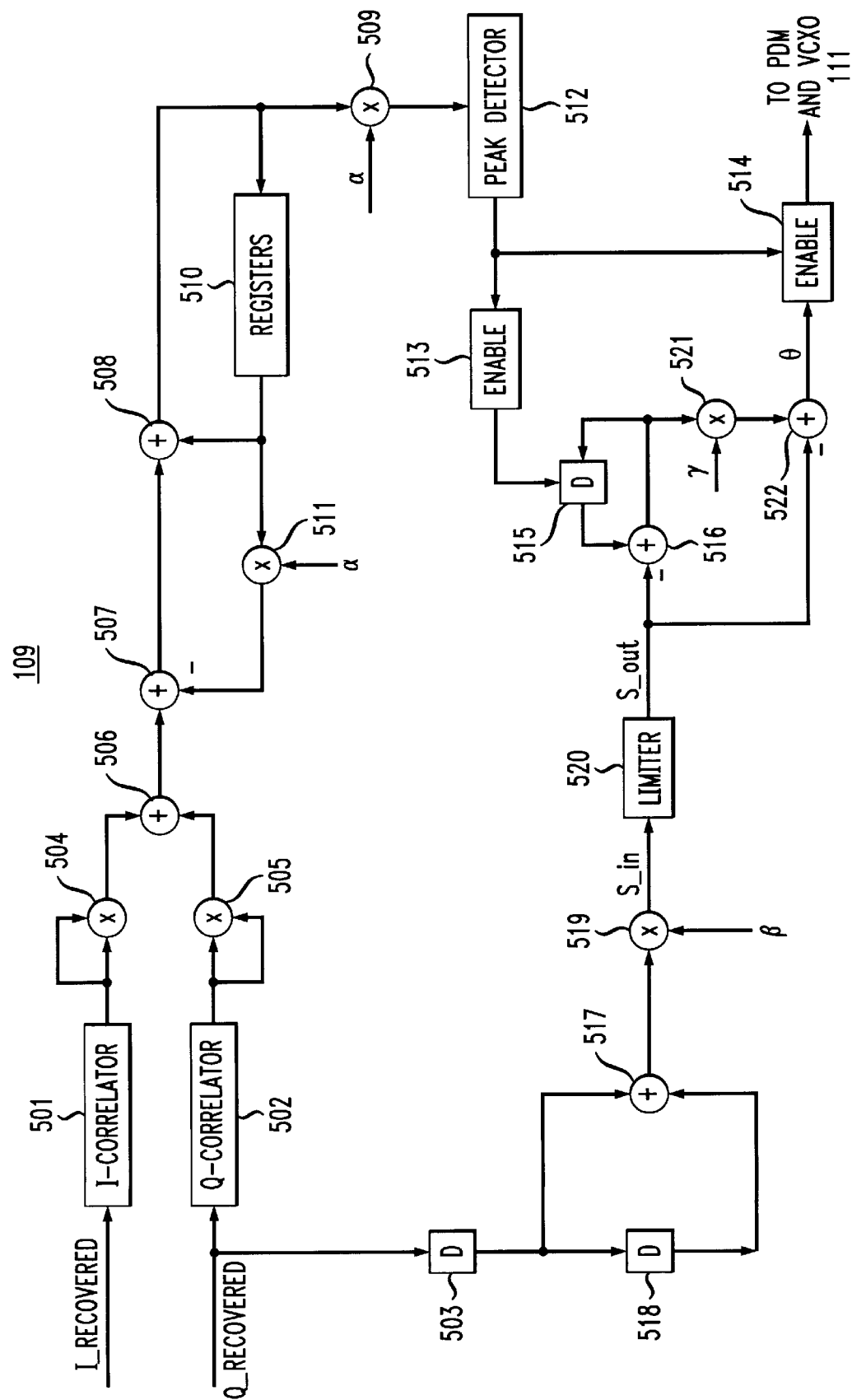
FIG. 5 illustrates, in simplified block diagram form, details of the timing recovery unit of FIG. 1.

FIG. 5 shows, in simplified form, details of timing recovery unit 109 of FIG. 1. I_recovered from FIG. 3 is supplied to I-correlator 501, while Q_recovered is supplied to Q-correlator 502 and delay unit 503. I-correlator 501 and Q-correlator 502 obtain correlated values of I and Q by searching for predetermined patterns in I_recovered and Q_recovered, respectively. Thus, I-correlator 501 yields I_correlated and Q-correlator 502 yields Q_correlated. Details of I-correlator 501 and Q-correlator 502 are described below in relationship to FIG. 6 and FIG. 7, respectively. I_correlated is supplied to multiplier 504 where it is squared. Similarly, Q_correlated is supplied to multiplier 505 where it is squared. The squared values of I_correlated and Q_correlated are supplied to combining unit 506 where they are summed. In turn, the summed values of I_correlated and Q_correlated are supplied to an input of combining unit 507. An output from multiplier 511 is supplied to another input of combining unit 507, where it is algebraically subtracted from the input from combining unit 506. An output from combining unit 507 is supplied to an input of combining unit 508 where it is algebraically summed with an output from registers unit 510. The output from registers unit 510 is also supplied to multiplier 511 where it is multiplied by $\alpha_i$. In this example, $\alpha_i=2^{-W_i}$, where $W_i$ has a range of 2–10 and typically is 6. An output from combining unit 508 is supplied to an input of registers unit 510 and to multiplier 509. Registers unit 510 includes a plurality of registers in a sequence, in this example, 832 registers. It is noted that combining units 507 and 508, registers unit 510 and multiplier 511 form essentially an IIR filter. Then, starting with register zero (0) of registers unit 510 and clocking through register 831, the value in each of the 832 registers is IIR filtered in sequence and supplied to multiplier 509, where the supplied value is multiplied by $\alpha_i$. The resulting output from multiplier 509 is a correlation average, which is supplied to peak detector 512. While cycling through the registers of registers unit 510, peak detector 512 selects the maximum value and generates an enable signal only during the duration that the corresponding register having the maximum value of all the registers during a current cycle is being clocked. The enable signal is supplied to enable unit 513 and enable unit 514. Enable unit 513 is operative to enable standard delay unit 515 to pass the current value at its input to an input of combining unit 516 during the current clock interval, otherwise the last previous value is supplied as an output from delay unit 515. Similarly, enable unit 514 is enabled to pass a current value supplied to its input when enabled and to pass the last previous value supplied to its input otherwise.

An output from delay unit 503 is supplied to an input of combining unit 517 and to an input of delay unit 518. An output from delay unit 518 is supplied to another input of combining unit 517, where it is algebraically summed with the output of delay unit 503. Combining unit 517 yields at its output the sum two consecutive values of Q_recovered, which is supplied to multiplier 519. Multiplier 519 multiplies the output from combining unit 517 by $\beta_i=2^{-X_i}$, where $X_i$ has a range of 2–10 and a typical value of 3. The output from multiplier 519 is a smoothed, i.e., average, value S_in of the summed values of Q_recovered, which is supplied to an input of limiter 520. The output S_out of limiter 520 is determined as follows:

S_out=S_in, if $|S\_in|\leq \Delta$, and

S_out=sign (S_in) *·$\delta_i$, if $|S\_in|>\Delta_i$, where $\Delta_i$ has a range of $2^5$–$2^8$ and, in this example, is typically $2^7$ and where $\delta_i$ has range of $2^5$–$2^8$ and, in this example, is typically $2^7$.

S_out from limiter 520 is supplied to an input of combining unit 516, where it is algebraically subtracted from the output from delay unit 515, and to an input of combining unit 522. An output from combining unit 516 is supplied to an input of delay unit 515 and to multiplier 521, where it is multiplied by $\gamma_i$. $\gamma_i=2^{Y_i}$ where $Y_i$ has a range of 8–16 and, in this example, a typical value of 10. An output from multiplier 521 is a frequency offset value and is also supplied to an input of combining unit 522. Combining unit 522 algebraically subtracts the S_out output from limiter 520 from the output from multiplier 521 to yield timing control signal θ. Again, enable unit 514 is enabled by the output from peak detector 512 to supply as an output the current value of θ, otherwise the last previous value of timing control signal θ is supplied as an output. Timing control signal θ is supplied to VCXO 111 (FIG. 1) and to PDM (not shown).

Figure 6:
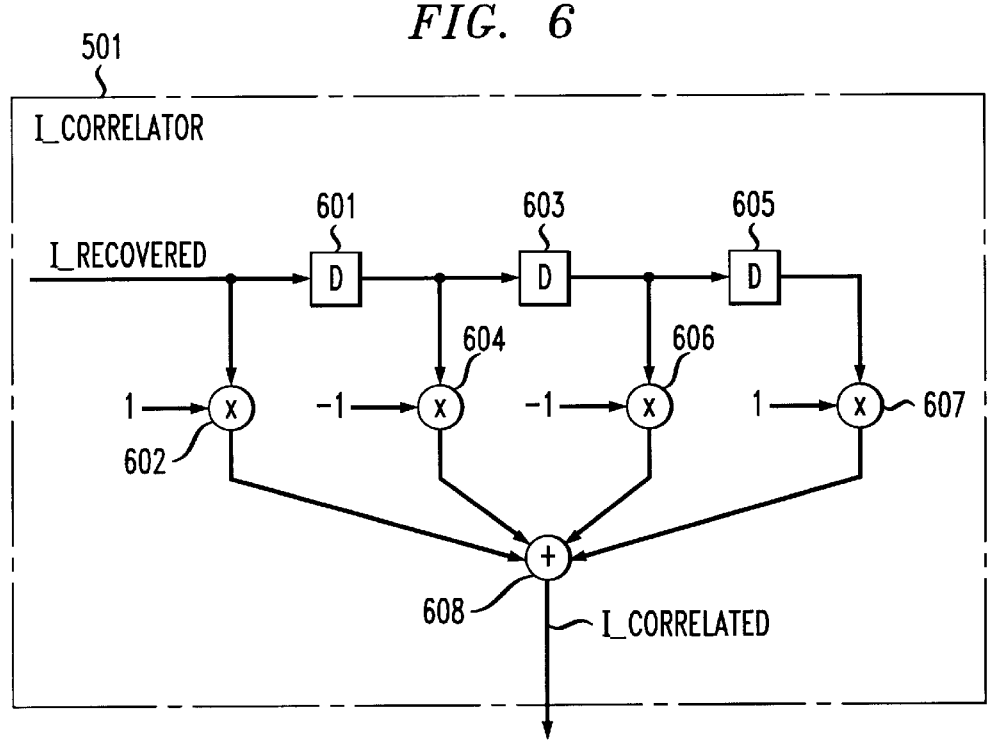
FIG. 6 illustrates, in simplified form, details of the I-Correlator of FIG. 5.

Details of I-correlator 501 are shown, in simplified form in FIG. 6. I-correlator 501 is employed to correlate I_recovered by a predetermined pattern, in this example, 1, −1, 1, −1. When this pattern is found the output from I-correlator 501 is a maximum. To this end, I_recovered is supplied to an input of delay unit 601 and to multiplier 602, where it is multiplied by 1. An output from multiplier 602 is supplied to an input of combining unit 608. An output from delay unit 601 is supplied to an input of delay unit 603 and to multiplier 604, where it is multiplied by −1. An output from multiplier 604 is supplied to an input of combining unit 608. An output from delay unit 603 is supplied to an input of delay unit 605 and to multiplier 606, where it is multiplied by −1. An output from multiplier 606 is supplied to an input of combining unit 608. An output from delay unit 605 is supplied to multiplier 607, where it is multiplied by 1. An output from multiplier 607 is supplied to an input of combining unit 608. Combining unit 608 algebraically sums the outputs from multipliers 602, 604, 606 and 607 to yield I_correlated.

Figure 7:
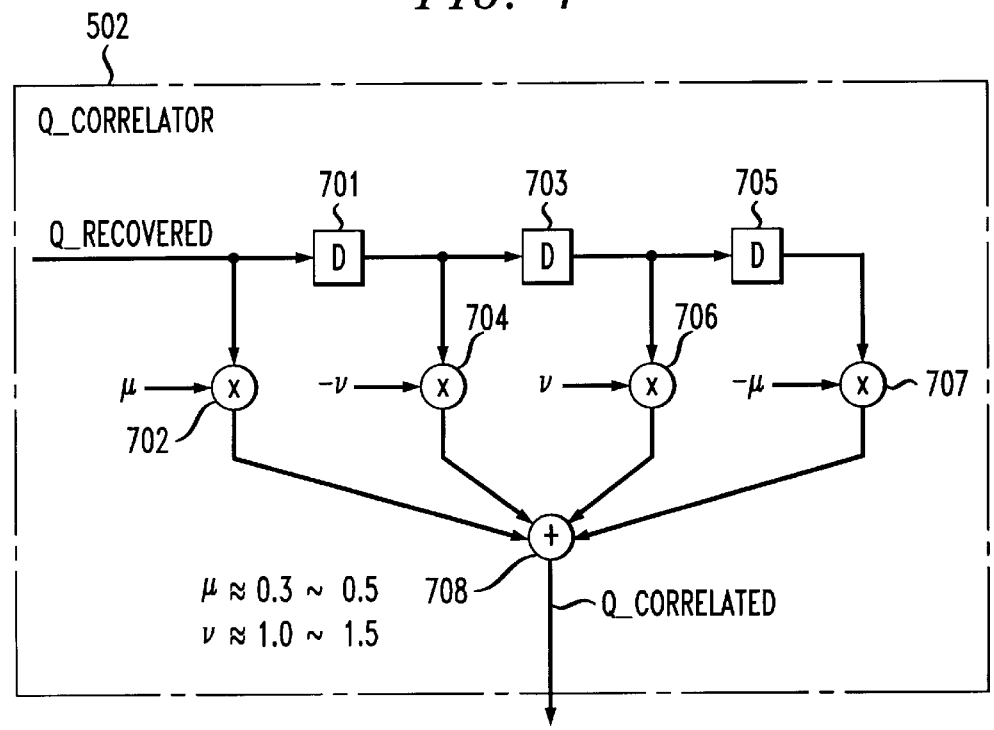
FIG. 7 illustrates, in simplified form, details of the Q-Correlator of FIG. 5.

Details of Q-correlator 502 are shown, in simplified form, in FIG. 7. Q-correlator 502 is employed to correlate Q_recovered by a predetermined pattern in this example, $\mu$, $-\nu$, $\mu$, $-\nu$. When this pattern is found the output from Q-correlator 502 is a maximum. To this end, Q_recovered is supplied to an input of delay unit 701 and to multiplier 702, where it is multiplied by $\mu$. An output from multiplier 702 is supplied to an input of combining unit 708. An output from delay unit 701 is supplied to an input of delay unit 703 and to multiplier 704, where it is multiplied by $-\nu$. An output from multiplier 704 is supplied to an input of combining unit 708. An output from delay unit 703 is supplied to an input of delay unit 705 and to multiplier 706, where it is multiplied by $\nu$. An output from multiplier 706 is supplied to an input of combining unit 708. An output from delay unit 705 is supplied to multiplier 707, where it is multiplied by $\mu$. An output from multiplier 707 is supplied to an input of combining unit 708. Combining unit 708 algebraically sums the outputs from multipliers 702, 704, 706 and 707 to yield Q_correlated. In this example, typical values for $\mu$ and $\nu$ are: $\mu\approx 0.3$–$0.5$ and $\nu\approx 1.0$–$1.5$.

All the parameters that are supplied to multipliers in this embodiment are powers of two (2) so that all multiplies can be implemented by utilizing shifts, thereby making it easier to implement an embodiment of the invention on VLSI, an ASIC or a DSP, as will be apparent to those skilled in the art.

What is claimed is:

1. A timing recovery system for use in a demodulator comprising:

correlator apparatus supplied with versions of a recovered in phase component and a quadrature phase component of a received signal for generating a correlation average for each of a plurality of segments of the received signal;

a peak detector for detecting the segment of said plurality having a maximum value;

apparatus supplied with the quadrature phase component version for generating a phase error signal;

apparatus responsive to said phase error signal for generating a frequency offset signal;

a first enable apparatus being responsive to an output from said peak detector indicating that a maximum has been detected for enabling generation of a new value for said frequency offset signal;

apparatus responsive to said phase error signal and said frequency offset signal for generating a timing control signal representative of phase; and a second enable apparatus being responsive to an output from said peak detector indicating that a maximum has been detected for enabling supplying as an output a new generated value of said timing control signal.

2. The timing recovery system as defined in claim 1 wherein said in phase component version is an in phase recovered version of the received in phase component and said quadrature phase component version is a quadrature phase recovered version of the received quadrature phase component.

3. The timing recovery system as defined in claim 1 wherein said correlator apparatus includes a first correlator for generating a correlated value of the in phase component version and a second correlator for generating a correlated value of the quadrature phase component version.

4. The timing recovery system as defined in claim 3 wherein said first correlator correlates the in phase component version with a first predetermined signal pattern and said second correlator correlates the quadrature phase component version with a second predetermined signal pattern.

5. The timing recovery system as defined in claim 4 wherein said first predetermined signal pattern is comprised of a y, −y, −y, y signal pattern and said second predetermined pattern is comprised of a $\mu$, −v, v, −$\mu$ signal pattern.

6. The timing recovery system as defined in claim 5 wherein y is typically one (1).

7. The timing recovery system as defined in claim 6 wherein $\mu$ is typically $\approx$0.3–0.5 and v is typically $\approx$1.0–1.5.

8. The timing recovery system as defined in claim 4 wherein said correlator apparatus further includes apparatus for squaring an output from said first correlator, apparatus for squaring an output from said second correlator, a combiner for algebraically summing the squared outputs from said first and second correlators and filter apparatus for yielding as an output said correlation average.

9. The timing recovery system as defined in claim 8 wherein said filter apparatus includes a plurality of registers for storing modified versions of a sequence of outputs from said combiner, a sequence of said correlation average values being supplied to said peak detector in sequence.

10. The timing recovery system as defined in claim 1 wherein said apparatus for generating said phase error signal includes apparatus responsive to said quadrature phase version of the received signal for generating an average value of a plurality of consecutive segments of said quadrature phase version and a limiter supplied with said average value for yielding said phase error signal.

11. The timing recovery system as defined in claim 10 wherein said limiter is operative to yield a first output equal to its input when the magnitude of its input is equal to or less than a first predetermined value and to yield a second output equal to the sign of its input multiplied by a predetermined parameter when the magnitude of its input is greater than said first predetermined value.

12. The timing recovery system as defined in claim 10 wherein said apparatus for generating said frequency offset signal includes an accumulator supplied with said phase error signal which is enabled by said first enable apparatus to generate a new frequency offset signal when enabled by said peak detector detecting said maximum.

13. The timing recovery system as defined in claim 10 wherein said quadrature phase component version is a quadrature phase recovered version of the received quadrature phase component.

14. Apparatus for receiving an incoming signal including at least a tuner, an analog to digital (A/D) converter, a voltage controlled crystal oscillator (VCXO) and a demodulator, the demodulator including at least a carrier recovery system and a timing recovery system, an output from the VCXO being supplied to said A/D, the carrier recover system generating a recovered in phase component and a quadrature phase component of the incoming signal, the timing recovery system comprising:

correlator apparatus supplied with the recovered in phase component and quadrature phase component of a received signal for generating a correlation average for each of a plurality of segments of the received signal;

a peak detector for detecting the segment of said plurality having a maximum value;

apparatus supplied with the quadrature phase component version for generating a phase error signal;

apparatus responsive to said phase error signal for generating a frequency offset signal;

a first enable apparatus being responsive to an output from said peak detector indicating that a maximum has been detected for enabling generation of a new value for said frequency offset signal;

apparatus responsive to said phase error signal and said frequency offset signal for generating a timing control signal representative of phase, the timing control signal being supplied to adjust the frequency of the VCXO; and a second enable apparatus being responsive to an output from said peak detector indicating that a maximum has been detected for enabling supplying as an output a new generated value of said timing control signal.

15. A timing recovery system for use in a demodulator comprising:

correlator means supplied with versions of a recovered in phase component and a quadrature phase component of a received signal for generating a correlation average for each of a plurality of segments of the received signal;

peak detector means for detecting the segment of said plurality having a maximum value;

means supplied with the quadrature phase component version for generating a phase error signal;

means responsive to said phase error signal for generating a frequency offset signal;

first enable means being responsive to an output from said peak detector means indicating that a maximum has been detected for enabling generation of a new value for said frequency offset signal;

means responsive to said phase error signal and said frequency offset signal for generating a timing control signal representative of phase; and second enable means being responsive to an output from said peak detector means indicating that a maximum has been detected for enabling supplying as an output a new generated value of said timing control signal.

16. The timing recovery system as defined in claim 15 wherein said in phase component version is an in phase recovered version of the received in phase component and said quadrature phase component version is a quadrature phase recovered version of the received quadrature phase component.

17. The timing recovery system as defined in claim 15 wherein said correlator means includes a first correlator means for generating a correlated value of the in phase component version and a second correlator means for generating a correlated value of the quadrature phase component version.

18. The timing recovery system as defined in claim 17 wherein said first correlator means correlates the in phase component version with a first predetermined signal pattern and said second correlator means correlates the quadrature phase component version with a second predetermined signal pattern.

19. The timing recovery system as defined in claim 18 wherein said first predetermined signal pattern is comprised of a y, −y, −y, y signal pattern and said second predetermined pattern is comprised of a $\mu$−v, v, −$\mu$ signal pattern.

20. The timing recovery system as defined in claim 19 wherein y is typically one (1).

21. The timing recovery system as defined in claim 20 wherein $\mu$ is typically ≈0.3–0.5 and v is typically ≈1.0–1.5.

22. The timing recovery system as defined in claim 18 wherein said correlator means further includes means for squaring an output from said first correlator means, means for squaring an output from said second correlator means, combining means for algebraically summing the squared outputs from said first and second correlator means and filter means for yielding as an output said correlation average.

23. The timing recovery system as defined in claim 22 wherein said filter means includes a plurality of register means for storing modified versions of a sequence of outputs from said combining means, a sequence of said correlation average values being supplied to said peak detector means in sequence.

24. The timing recovery system as defined in claim 15 wherein said means for generating said phase error signal includes means responsive to said quadrature phase version of the received signal for generating an average value of a plurality of consecutive segments of said quadrature phase version and limiter means supplied with said average value for yielding said phase error signal.

25. The timing recovery system as defined in claim 24 wherein said limiter means is operative to yield a first output equal to its input when the magnitude of its input is equal to or less than a first predetermined value and to yield a second output equal to the sign of its input multiplied by a predetermined parameter when the magnitude of its input is greater than said first predetermined value.

26. The timing recovery system as defined in claim 24 wherein said means for generating said frequency offset signal includes accumulator means supplied with said phase error signal which is enabled to generate a new frequency offset signal when enabled by said peak detector means detecting said maximum.

27. The timing recovery system as defined in claim 24 wherein said quadrature phase component version is a quadrature phase recovered version of the received quadrature phase component.

28. Apparatus for receiving an incoming signal including at least a tuner, an analog to digital (A/D) converter, a voltage controlled crystal oscillator (VCXO) and a demodulator, the demodulator including at least a carrier recovery system and a timing recovery system, an output from the VCXO being supplied to said A/D, the carrier recover system generating a recovered in phase component and a quadrature phase component of the incoming signal, the timing recovery system comprising:

correlator means supplied with the recovered in phase component and quadrature phase component of a received signal for generating a correlation average for each of a plurality of segments of the received signal;

peak detector means for detecting the segment of said plurality having a maximum value;

means supplied with the quadrature phase component version for generating a phase error signal;

means responsive to said phase error signal for generating a frequency offset signal;

first enable means being responsive to an output from said peak detector means indicating that a maximum has been detected for enabling generation of a new value for said frequency offset signal;

means responsive to said phase error signal and said frequency offset signal for generating a timing control signal representative of phase, the timing control signal being supplied to adjust the frequency of the VCXO; and second enable means being responsive to an output from said peak detector means indicating that a maximum has been detected for enabling supplying as an output a new generated value of said timing control signal.

* * * * *